United States Patent
Huang

(10) Patent No.: US 11,688,360 B2
(45) Date of Patent: Jun. 27, 2023

(54) OVERCURRENT PROTECTION CIRCUIT AND DISPLAY DRIVE DEVICE

(71) Applicant: HKC Corporation Limited, Shenzhen (CN)

(72) Inventor: Xiaoyu Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 333 days.

(21) Appl. No.: 17/042,764

(22) PCT Filed: Nov. 8, 2018

(86) PCT No.: PCT/CN2018/114667
§ 371 (c)(1),
(2) Date: Sep. 28, 2020

(87) PCT Pub. No.: WO2020/087559
PCT Pub. Date: May 7, 2020

(65) Prior Publication Data
US 2021/0027738 A1    Jan. 28, 2021

(30) Foreign Application Priority Data
Oct. 29, 2018  (CN) .......................... 201811271245.2

(51) Int. Cl.
*G09G 3/36* (2006.01)
*H03K 17/0812* (2006.01)
(Continued)

(52) U.S. Cl.
CPC ..... *G09G 3/3696* (2013.01); *H03K 17/08122* (2013.01); *H03K 17/08142* (2013.01);
(Continued)

(58) Field of Classification Search
None
See application file for complete search history.

(56) References Cited

U.S. PATENT DOCUMENTS 4,494,013 A * 1/1985 Ludowyk ........... G01R 19/0038
327/403
4,775,913 A * 10/1988 Ekblad ..................... F16P 3/12
361/189
(Continued)

FOREIGN PATENT DOCUMENTS

CN  200941553 Y   8/2007
CN  101169816 A   4/2008
(Continued)

OTHER PUBLICATIONS

International Search Report dated Feb. 1, 2019, issued in corresponding International Application No. PCT/CN2018/114667, filed Nov. 8, 2018, 2 pages.
(Continued)

*Primary Examiner* — Fred Tzeng
(74) *Attorney, Agent, or Firm* — Hauptman Ham, LLP

(57) ABSTRACT

An overcurrent protection circuit and display drive device, comprising: when input current of a front end corresponding to a logic signal experiences overcurrent, preventing the input current of the front end experiencing overcurrent from being transmitted to a drive chip, thereby preventing damage to the drive chip.

18 Claims, 2 Drawing Sheets

(51) Int. Cl.
*H03K 17/0814* (2006.01)
*G02F 1/13357* (2006.01)

(52) U.S. Cl.
CPC .......... *G02F 1/133602* (2013.01); *G09G 2300/0857* (2013.01); *G09G 2330/04* (2013.01)

(56) References Cited

U.S. PATENT DOCUMENTS

| | | | |
|---|---|---|---|
| 6,441,679 B1* | 8/2002 | Ohshima | H03K 17/0822 323/282 |
| 9,667,196 B2 | 5/2017 | Midya | |
| 10,158,282 B1* | 12/2018 | Maruyama | H02M 3/01 |
| 10,205,376 B2* | 2/2019 | Choi | H02M 1/32 |
| 2006/0125450 A1* | 6/2006 | Tabaian | H02M 3/33592 323/222 |
| 2009/0039849 A1* | 2/2009 | Chang | G05F 1/575 361/18 |
| 2012/0212251 A1* | 8/2012 | Yanagishima | H02P 31/00 324/762.01 |
| 2014/0035530 A1* | 2/2014 | Shao | B60L 53/63 320/109 |
| 2014/0111253 A1* | 4/2014 | Fukuta | H03K 3/01 327/109 |
| 2014/0176014 A1* | 6/2014 | Hu | G09G 3/3426 315/307 |
| 2014/0307351 A1* | 10/2014 | Zhang | H02H 7/20 361/18 |
| 2017/0194959 A1* | 7/2017 | Yanagishima | H04L 25/028 |
| 2018/0145674 A1* | 5/2018 | Bunin | H03K 17/0828 |
| 2018/0174501 A1 | 6/2018 | Cao et al. | |
| 2019/0140630 A1* | 5/2019 | Chen | H03K 17/163 |
| 2020/0294444 A1* | 9/2020 | Yang | H05B 45/39 |

FOREIGN PATENT DOCUMENTS

| CN | 104122925 A | 10/2014 |
|---|---|---|
| CN | 105304050 A | 2/2016 |
| CN | 106843354 A | 6/2017 |
| CN | 206293885 U | 6/2017 |
| CN | 106972456 A | 7/2017 |
| CN | 107810421 A | 3/2018 |
| CN | 107909972 A | 4/2018 |

OTHER PUBLICATIONS

Notice of Reason for Rejection dated Nov. 5, 2019, issued in Chinese Application No. 201811271245.2, filed Oct. 29, 2018, 9 pages.

Notice of Reason for Rejection dated Jul. 20, 2020, issued in Chinese Application No. 201811271245.2, filed Oct. 29, 2018, 10 pages.

Office Action dated Jan. 21, 2021, issued in Chinese Application No. 201811271245.2, filed Oct. 29, 2018, 10 pages.

\* cited by examiner

OVERCURRENT PROTECTION CIRCUIT AND DISPLAY DRIVE DEVICE

CROSS REFERENCE TO RELATED APPLICATIONS

This disclosure claims the priority to Chinese application No. 2018112712452, entitled "OVERCURRENT PROTECTION CIRCUIT AND DISPLAY DRIVING DEVICE", and filed on Oct. 29, 2018, the entire content of which is incorporated herein by reference in its entirety.

TECHNICAL FIELD

The present disclosure relates to an overcurrent protection circuit and a display driving device.

BACKGROUND

A Liquid crystal display panel is a display device consisted of a certain number of color pixels or black and white pixels and placed in front of a light source or a reflective surface. TFT-LCD (Thin Film Transistor Liquid Crystal Display) is one of the main types of the current liquid crystal display panels, which has become an important display platform in modern IT and video products. Taking a display driver of the TFT-LCD as an example, a R/G/B compression signal, a control signal and a power source are connected to a connector on a PCB board via wires by a main system board, data after processed by a TCON (Timing Controller) IC on the PCB board is connected to a display area via the PCB board, through a S-COF (Source-Chip on Film) and a G-COF (Gate-Chip on Film), and a voltage is transmitted via a Data line and a Scan line on a display array, so that the TFT-LCD realizes the display function. That is, in the liquid crystal display panel, a logic signal input into a front-end input needs to be converted into a driving signal via a corresponding driver chip.

However, the inventors has found that when the front-end input is abnormal or the display array is abnormal, a current input to the driver chip is likely to be excessive, so that the driver chip is damaged due to an overcurrent.

SUMMARY

The present disclosure relates to an overcurrent protection circuit and a display driving device.

An overcurrent protection circuit includes a voltage generation module, a voltage comparison module and a controlled switch module, wherein a first input end of the voltage comparison module is configured to access a logic signal, a second input end of the voltage comparison module is configured to access the logic signal via the voltage generation module, and an output end of the voltage comparison module is connected to a controlled end of the controlled switch module, wherein an input end of the controlled switch module is configured to access the logic signal, and an output end of the controlled switch module is configured to be connected to an input end of a driver chip, wherein the voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end.

In an embodiment, the voltage generation module includes a voltage stabilizing circuit; and one end of the voltage stabilizing circuit is configured to access the logic signal, and to be connected to the second input end, and another end of the voltage stabilizing circuit is configured to be grounded.

In an embodiment, the voltage stabilizing circuit includes a voltage stabilizing diode.

In an embodiment, the controlled switch module includes an electronic switch or a field effect transistor; and wherein the controlled end of the controlled switch module is a gate electrode of the field effect transistor.

In an embodiment, the controlled switch module includes a P-channel field effect transistor; and the controlled end of the controlled switch module is a gate electrode of the P-channel field effect transistor, the input end of the controlled switch module is a source electrode of the P-channel field effect transistor, and the output end of the controlled switch module is a drain electrode of the P-channel field effect transistor.

In an embodiment, a bias resistor is further included, and wherein the gate electrode of the p-channel field effect transistor is connected to the source electrode of the P-channel field effect transistor via the bias resistor.

In an embodiment, the voltage comparison module includes a comparator; and the first input end of the voltage comparison module is an inverting input end of the comparator, the second input end of the voltage comparison module is a non-inverting input end of the comparator, and the output end of the voltage comparison module is an output end of the comparator.

In an embodiment, the voltage comparison module further includes a D-type positive-edge-triggered flip-flop; and a control end of the D-type positive-edge-triggered flip-flop is connected to the output end of the comparator, a pulse input end of the D-type positive-edge-triggered flip-flop is configured to access a preset high level signal, and an output end of the D-type positive-edge-triggered flip-flop is the output end of the voltage comparison module.

In an embodiment, the voltage comparison module includes a NAND gate circuit; and wherein the first input end of the voltage comparison module is an input end of the NAND gate circuit, the second input end of the voltage comparison module is another input end of the NAND gate circuit, and the output end of the voltage comparison module is an output end of the NAND gate circuit.

A display driving device includes a driver chip and an overcurrent protection circuit; and wherein the overcurrent protection circuit includes a voltage generation module, a voltage comparison module and a controlled switch module, wherein a first input end of the voltage comparison module is configured to access a logic signal, a second input end of the voltage comparison module is configured to access the logic signal via the voltage generation module, and an output end of the voltage comparison module is connected to a controlled end of the controlled switch module, wherein an input end of the controlled switch module is configured to access the logic signal, and an output end of the controlled switch module is configured to be connected to an input end of the driver chip, wherein the voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end, and wherein an output end of the driver chip is configured to output a driving signal to a display array of a liquid crystal display panel.

In an embodiment, the voltage generation module includes a voltage stabilizing circuit; and one end of the voltage stabilizing circuit is configured to access the logic signal, and to be connected to the second input end, and another end of the voltage stabilizing circuit is configured to be grounded.

In an embodiment, the voltage stabilizing circuit includes a voltage stabilizing diode.

In an embodiment, the controlled switch module includes an electronic switch or a field effect transistor; and wherein the controlled end of the controlled switch module is a gate electrode of the field effect transistor.

In an embodiment, the controlled switch module includes a P-channel field effect transistor; and the controlled end of the controlled switch module is a gate electrode of the P-channel field effect transistor, the input end of the controlled switch module is a source electrode of the P-channel field effect transistor, and the output end of the controlled switch module is a drain electrode of the P-channel field effect transistor.

In an embodiment, a bias resistor is further included, and wherein the gate electrode of the p-channel field effect transistor is connected to the source electrode of the P-channel field effect transistor via the bias resistor.

In an embodiment, the voltage comparison module includes a comparator; and the first input end of the voltage comparison module is an inverting input end of the comparator, the second input end of the voltage comparison module is a non-inverting input end of the comparator, and the output end of the voltage comparison module is an output end of the comparator.

In an embodiment, the voltage comparison module further includes a D-type positive-edge-triggered flip-flop; and a control end of the D-type positive-edge-triggered flip-flop is connected to the output end of the comparator, a pulse input end of the D-type positive-edge-triggered flip-flop is configured to access a preset high level signal, and an output end of the D-type positive-edge-triggered flip-flop is the output end of the voltage comparison module.

In an embodiment, the voltage comparison module includes a NAND gate circuit; and wherein the first input end of the voltage comparison module is an input end of the NAND gate circuit, the second input end of the voltage comparison module is another input end of the NAND gate circuit, and the output end of the voltage comparison module is an output end of the NAND gate circuit.

A display device includes a display driving device, a backlight panel and a display array; and wherein the display driving device includes a driver chip and an overcurrent protection circuit, wherein the overcurrent protection circuit includes a voltage generation module, a voltage comparison module and a controlled switch module, wherein a first input end of the voltage comparison module is configured to access a logic signal, a second input end of the voltage comparison module is configured to access the logic signal via the voltage generation module, and an output end of the voltage comparison module is connected to a controlled end of the controlled switch module, wherein an input end of the controlled switch module is configured to access the logic signal, and an output end of the controlled switch module is configured to be connected to an input end of the driver chip, wherein the voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end;

wherein an output end of the driver chip is configured to output a driving signal to the display array; and wherein the backlight panel is configured to provide a light source for the display array.

In an embodiment, the display array includes a liquid crystal display array.

The details of one or more embodiments of the present disclosure are set forth in the accompanying drawings and the description below. Other features and advantages of the present disclosure will become apparent from the description, the accompanying drawings, and the claims.

BRIEF DESCRIPTION OF THE DRAWINGS

To illustrate the technical solutions according to the embodiments of the present disclosure more clearly, the accompanying drawings for describing the embodiments are introduced briefly below. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

In order to make the technical solutions and advantages of the present disclosure more clear, the present disclosure will be further described in detail with reference to the accompanying drawings and embodiments below. It should be understood that the specific embodiments described herein are only used to explain the present disclosure and not intended to limit the present disclosure.

An overcurrent protection circuit is provided according to an embodiment of the present disclosure.

Figure 1:
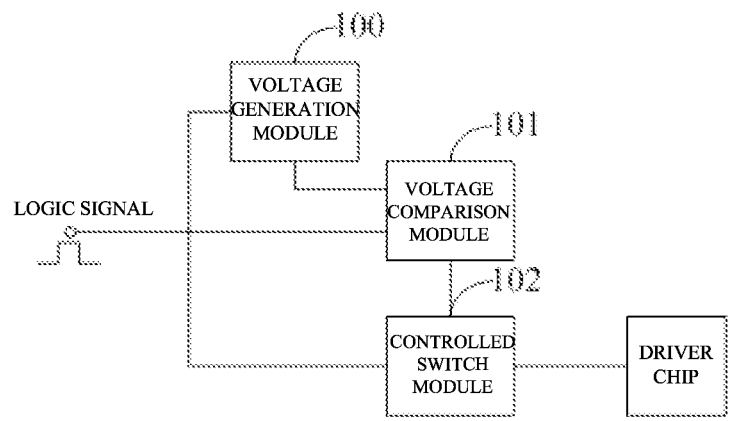
FIG. 1 is a modular structure diagram of an overcurrent protection circuit according to one or more embodiments.

FIG. 1 is a modular structure diagram of an overcurrent protection circuit according to one or more embodiments. As shown in FIG. 1, an overcurrent protection circuit of an implementation includes a voltage generation module 100, a voltage comparison module 101 and a controlled switch module 102.

A first input end of the voltage comparison module 101 is configured to access a logic signal, a second input end of the voltage comparison module 101 is configured to access the logic signal via the voltage generation module 100, and an output end of the voltage comparison module 101 is connected to a controlled end of the controlled switch module.

In an embodiment, the accessed logic signal is a logic signal input into a front-end input, which is generally an electrical signal in a form of a voltage pulse, and is transmitted to a driver chip by a main system board. Since a power of the main system board is constant, a voltage corresponding to the logic signal will be dropped when an overcurrent occurs in the front-end input. In an embodiment, the voltage generation module 100 generates a reference voltage at the second input end of the voltage comparison module 101 according to a voltage corresponding to a normal logic signal. In an embodiment, the reference voltage is the same as the voltage corresponding to the normal logic signal. Meanwhile, the reference voltage generated by the voltage generation module 100 remains unchanged when the overcurrent is occurred in the logic signal and the voltage corresponding to the logic signal becomes lower.

In an embodiment, the voltage generation module 100 includes a voltage stabilizing circuit.

One end of the voltage stabilizing circuit is configured to access the logic signal, and to be connected to the second input end, and another end of the voltage stabilizing circuit is configured to be grounded.

In an embodiment, the voltage at the second input end is the same as the voltage at the first input end when the logic signal is normal. When the overcurrent is occurred in the logic signal, the voltage at the first input end is dropped and the voltage at the second input end remains unchanged due to the voltage stabilizing function of the voltage stabilizing circuit. Thus, a voltage difference is appeared between the first input end and the second input end when the overcurrent is occurred in the logic signal.

Figure 2:
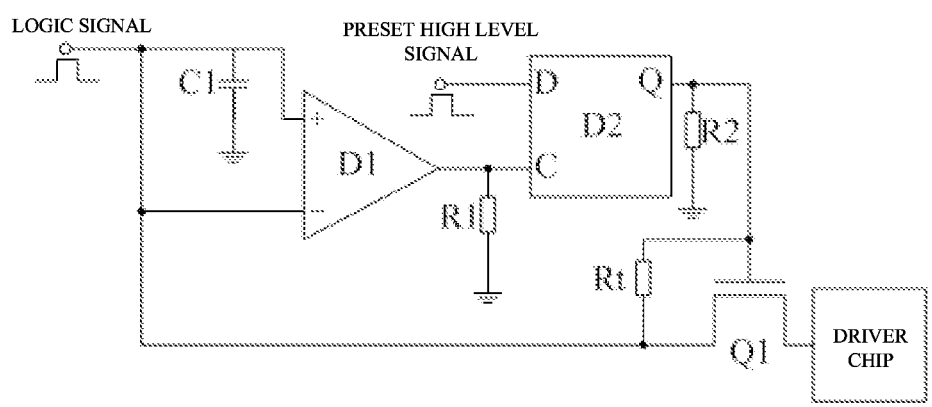
FIG. 2 is a circuit diagram of an overcurrent protection circuit according to one or more embodiments.

In an embodiment, FIG. 2 is a circuit diagram of an overcurrent protection circuit according to one or more embodiments. As shown in FIG. 2, the voltage stabilizing circuit includes a voltage stabilizing capacitor C1.

In an embodiment, when the logic signal is normal, the voltage stabilizing capacitor C1 is charged, so that the voltage at the second input end is the same as the voltage at the first input end after finishing the charging. When an overcurrent is occurred in the logic signal, the voltage at the first input end is dropped, and a stable voltage difference is maintained between two ends of the voltage stabilizing capacitor C1 due to the finishing of the charging, so that the voltage at the second input end remains unchanged.

In an embodiment, the voltage stabilizing circuit includes a voltage stabilizing diode.

A negative electrode of the voltage stabilizing diode is configured to access the logic signal, and to be connected to the second input end; and a positive electrode of the voltage stabilizing diode is configured to be grounded.

An input end of the controlled switch module 102 is configured to access the logic signal, and an output end of the controlled switch module 102 is configured to be connected to an input end of a driver chip.

In an embodiment, a path is formed when the controlled switch module 102 is turned on with conduction between the input end and the output end of the controlled switch module, and the logic signal may be transmitted to the input end of the driver chip via the input end and the output end of the controlled switch module 102 sequentially.

The voltage comparison module 101 is configured to control the controlled switch module 102 to be turned on with conduction between the input end and the output end of the controlled switch module through the controlled end when the voltage at the first input end is the same as the voltage at the second input end, and to control the controlled switch module 102 to be turned off with no conduction between the input end and the output end of the controlled switch module through the controlled end when the voltage at the first input end is not the same as the voltage at the second input end.

In an embodiment, the voltage comparison module 101 compares the voltage at the first input end with the voltage at the second input end, and outputs an electrical signal to the controlled end of the controlled switch module 102 according to a comparison result, to control the ON or OFF of the controlled switch module 102. In an embodiment, the voltage comparison module 101 outputs the electrical signal that may turn on the controlled switch module 102 with conduction between the input end and the output end of the controlled switch module when the voltage at the first input end is the same as the voltage at the second input end, and outputs the electrical signal that may turn off the controlled switch module 102 with no conduction between the input end and the output end of the controlled switch module when the voltage at the first input end is not the same as the voltage at the second input end.

In an embodiment, the controlled switch module 102 includes an electronic switch or a field effect transistor.

In an embodiment, the controlled end of the controlled switch module 102 is a gate electrode of the field effect transistor.

In an embodiment, taking the electronic switch as an example, the controlled end of the electronic switch can receive an electrical signal transmitted by the voltage comparison module 101, and the electronic switch can be turned on with conduction between the input end and the output end thereof or turned off with no conduction between the input end and the output end thereof according to a preset logic. Taking the field effect transistor as an example, whether a logic level of a gate voltage of the field effect transistor is a high level or a low level may be determined by the electrical signal transmitted by the voltage comparison module 101, so as to turn on or turn off a source electrode and a drain electrode.

In an embodiment, as shown in FIG. 2, the controlled switch module 102 includes a P-channel field effect transistor.

The controlled end of the controlled switch module 102 is a gate electrode of the P-channel field effect transistor Q1, the input end of the controlled switch module 102 is a source electrode of the P-channel field effect transistor Q1, and the output end of the controlled switch module 102 is a drain electrode of the P-channel field effect transistor Q1.

In an embodiment, when the voltage at the first input end is the same as the voltage at the second input end, the voltage comparison module 101 outputs the electrical signal with a low level, and the P-channel field effect transistor Q1 is turned on; and when the voltage at the first input end is not the same as the voltage at the second input end, the voltage comparison module 101 outputs the electrical signal with a high level, and the P-channel field effect transistor Q1 is turned off.

In an embodiment, as shown in FIG. 2, a bias resistor Rt is further included.

The gate electrode of the p-channel field effect transistor Q1 is connected to the source electrode of the P-channel field effect transistor Q1 via the bias resistor Rt.

In an embodiment, the gate electrode of the p-channel field effect transistor Q1 is connected to the source electrode thereof via a bias resistor Rt. In an embodiment, a bias voltage is applied to the field effect transistor through the bias resistor Rt to better maintain the operating characteristic of the field effect transistor.

In an embodiment, as shown in FIG. 2, the voltage comparison module 101 includes a comparator D1.

The first input end of the voltage comparison module 101 is an inverting input end of the comparator D1, the second input end of the voltage comparison module 101 is a non-inverting input end of the comparator D1, and the output end of the voltage comparison module 101 is an output end of the comparator D1.

When the logic signal is normal, the voltage at the non-inverting input end of the comparator D1 is the same as the voltage at the inverting input end, and the comparator D1 outputs a low level, so that the controlled switch module 102 is turned on with conduction between the input end and the output end thereof; and when the logic signal is an overcurrent, the voltage at the non-inverting input end of the comparator D1 is larger than the voltage at the inverting input end, and the comparator D1 outputs a high level, so that the controlled switch module 102 is turned off with no conduction between the input end and the output end of the controlled switch module.

In an embodiment, as shown in FIG. 2, the voltage comparison module 102 further includes a D-type positive-edge-triggered flip-flop D2.

A control end C of the D-type positive-edge-triggered flip-flop D2 is connected to the output end of the comparator D1, a pulse input end D of the D-type positive-edge-triggered flip-flop D2 is configured to access a preset high level signal, and an output end Q of the D-type positive-edge-triggered flip-flop D2 is the output end of the voltage comparison module 101.

In an embodiment, when the logic signal is normal, the voltage at the non-inverting input end of the comparator D1 is the same as the voltage at the inverting input end, the comparator D1 outputs a low level, the control end C of the D-type positive-edge-triggered flip-flop D2 receives the low level, and the output end Q of the D-type positive-edge-triggered flip-flop D2 outputs a low level, so that the controlled switch module 102 is turned on with conduction between the input end and the output end of the controlled switch module; and when the logic signal is an overcurrent, the voltage at the non-inverting input end of the comparator D1 is larger than the voltage at the inverting input end, the output of the comparator D1 is converted from a low level to a high level, the control end C of the D-type positive-edge-triggered flip-flop D2 receives a positive-edge converted from a low level to a high level, the D-type positive-edge-triggered flip-flop D2 assigns the preset high level signal at the pulse input end D to the output end Q, to control the controlled switch module 102 to be turned off with no conduction between the input end and the output end of the controlled switch module. In an embodiment, with the presetting of the preset high level signal, the operating characteristic of different controlled switch module 102 may be satisfied, and a high level may be output stably to satisfy the operating requirement of the controlled switch module 102.

In an embodiment, as shown in FIG. 2, a first protection resistor R1 is further included.

The output end of the comparator D1 is configured to be grounded via the first protection resistor R1.

In an embodiment, as shown in FIG. 2, a second protection resistor R2 is further included.

The output end Q of the D-type positive-edge-triggered flip-flop D2 is configured to be grounded via the second protection resistor R2.

Figure 3:
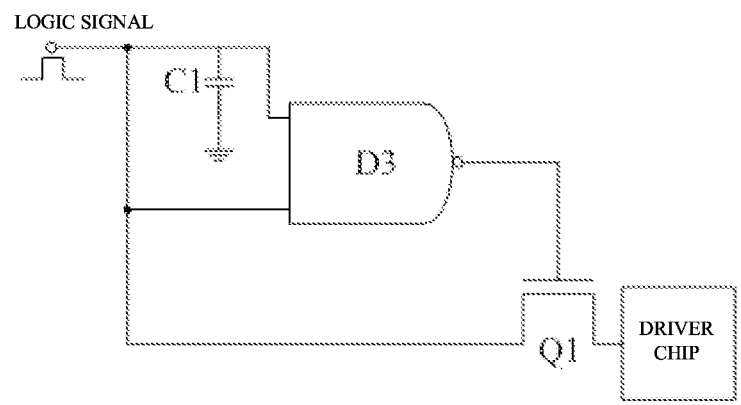
FIG. 3 is another circuit diagram of an overcurrent protection circuit according to one or more embodiments.

In an embodiment, FIG. 3 is a circuit diagram of another overcurrent protection circuit according to one or more embodiments. As shown in FIG. 3, the voltage comparison module 101 includes a NAND gate circuit D3.

The first input end of the voltage comparison module 101 is an input end of the NAND gate circuit D3, the second input end of the voltage comparison module 101 is another input end of the NAND gate circuit D3, and the output end of the voltage comparison module 101 is an output end of the NAND gate circuit D3.

In an embodiment, when the logic signal is normal, the corresponding voltage is a voltage with a high level 1; and when the logic signal is an overcurrent, the corresponding voltage is a voltage with a low level 0. When the logic signal is normal, the NAND gate circuit outputs a voltage with a low level 0, so that the controlled switch module 102 is turned on with conduction between the input end and the output end of the controlled switch module; and when the logic signal is an overcurrent, the NAND gate circuit outputs a voltage with a high level 1, so that the controlled switch module 102 is turned off with no conduction between the input end and the output end of the controlled switch module.

A display driving device is provided according to an embodiment of the present disclosure.

Figure 4:
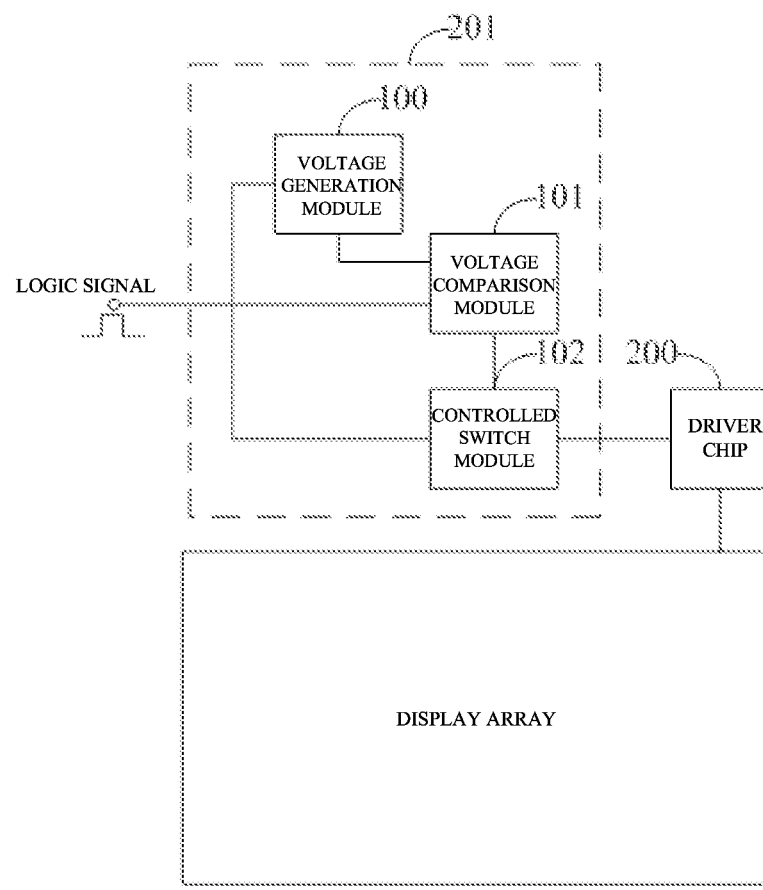
FIG. 4 is a modular structure diagram of a display driving device according to one or more embodiments.

FIG. 4 is a modular structure diagram of a display driving device according to one or more embodiments. As shown in FIG. 4, the display driving device includes a driver chip 200 and an overcurrent protection circuit 201.

The overcurrent protection circuit 201 includes a voltage generation module 100, a voltage comparison module 101 and a controlled switch module 102.

A first input end of the voltage comparison module 101 is configured to access a logic signal, a second input end of the voltage comparison module 101 is configured to access the logic signal via the voltage generation module 100, and an output end of the voltage comparison module 101 is connected to a controlled end of the controlled switch module 102.

An input end of the controlled switch module 102 is configured to access the logic signal, and an output end of the controlled switch module 102 is configured to be connected to an input end of the driver chip 200.

The voltage comparison module 101 is configured to control the controlled switch module 102 to be turned on with conduction between the input end and the output end of the controlled switch module through the controlled end when a voltage at the first input end is the same as a voltage at the second input end, and to control the controlled switch module 102 to be turned off with no conduction between the input end and the output end of the controlled switch module through the controlled end when the voltage at the first input end is not the same as the voltage at the second input end.

An output end of the driver chip 200 is configured to output a driving signal to a display array of a liquid crystal display panel.

In the above overcurrent protection circuit and the display driving device, when the front-end input current corresponding to the logic signal is normal, the voltage generation module 100 controls that the voltage at the first input end of the voltage comparison module 101 is the same as the voltage at the second input end, the controlled switch module 102 is turned on with conduction between the input end and the output end of the controlled switch module, and the logic signal is transmitted to the driver chip for the normal operation. When an overcurrent occurs in the front-end input current corresponding to the logic signal, the voltage at the first input end of the voltage generation module 100 is dropped, and the voltage at the second input end remains unchanged, at the same time the voltage comparison module 101 controls that the controlled switch module 102 is turned off with no conduction between the input end and the output end of the controlled switch module, preventing the front-end input current with an overcurrent is transmitted to the driver chip, and avoiding the damage of the driver chip. In view of the above, the influence of the overcurrent on the driver chip is effectively prevented.

A display device is provided according to an embodiment of the present disclosure.

A display device includes a display driving device, a backlight panel and a display array.

The display driving device includes a driver chip and an overcurrent protection circuit.

The overcurrent protection circuit includes a voltage generation module, a voltage comparison module and a controlled switch module, A first input end of the voltage comparison module is configured to access a logic signal, a second input end of the voltage comparison module is configured to access the logic signal via the voltage generation module, and an output end of the voltage comparison module is connected to a controlled end of the controlled switch module.

An input end of the controlled switch module is configured to access the logic signal, and an output end of the controlled switch module is configured to be connected to an input end of a driver chip.

The voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end.

An output end of the driver chip is configured to output a driving signal to the display array.

The backlight panel is configured to provide a light source for the display array.

In an embodiment, the display array includes a liquid crystal display array.

The technical features of the above-described embodiments may be combined arbitrarily. To simplify the description, all the possible combinations of the technical features in the above embodiments are not described. However, all of the combinations of these technical features should be considered as within the scope of the present disclosure, as long as such combinations do not contradict with each other.

The above embodiments merely illustrate several embodiments of the present disclosure, and the description thereof is specific and detailed, but it shall not be constructed as limiting the scope of the present disclosure. It should be noted that a number of variations and improvements may be made by persons of ordinary skill in the art without departing from the concept of the present disclosure, which shall all fall into the protection scope of the present disclosure. Therefore, the protection scope of the present disclosure shall be subject to the appended claims.

What is claimed is:

1. An overcurrent protection circuit, comprising:
   a voltage generation module;
   a voltage comparison module;
   a controlled switch module; and
   a bias resistor,
   wherein a first input end of the voltage comparison module is configured to access a logic signal, a second input end of the voltage comparison module is configured to access the logic signal via the voltage generation module, and an output end of the voltage comparison module is connected to a controlled end of the controlled switch module,
   wherein an input end of the controlled switch module is configured to access the logic signal, and an output end of the controlled switch module is configured to be connected to an input end of a driver chip, wherein the controlled switch module comprises P-channel field effect transistor, the controlled end of the controlled switch module is a gate electrode of the P-channel field effect transistor, the input end of the controlled switch module is a source electrode of the P-channel field effect transistor, the output end of the controlled switch module is a drain electrode of the P-channel field effect transistor, and the gate electrode of the P-channel field effect transistor is connected to the source electrode of the P-channel field effect transistor via the bias resistor, and
   wherein the voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end.

2. The overcurrent protection circuit according to claim 1, wherein the voltage generation module comprises a voltage stabilizing circuit; and
   wherein one end of the voltage stabilizing circuit is configured to access the logic signal, and to be connected to the second input end, and
   another end of the voltage stabilizing circuit is configured to be grounded.

3. The overcurrent protection circuit according to claim 2, wherein the voltage stabilizing circuit comprises a voltage stabilizing capacitor.

4. The overcurrent protection circuit according to claim 1, wherein the voltage comparison module comprises a comparator; and
   wherein the first input end of the voltage comparison module is an inverting input end of the comparator, the second input end of the voltage comparison module is a non-inverting input end of the comparator, and the output end of the voltage comparison module is an output end of the comparator.

5. The overcurrent protection circuit according to claim 4, wherein the voltage comparison module comprises a D-type positive-edge-triggered flip-flop; and
wherein a control end of the D-type positive-edge-triggered flip-flop is connected to the output end of the comparator, a pulse input end of the D-type positive-edge-triggered flip-flop is configured to access a preset high level signal, and an output end of the D-type positive-edge-triggered flip-flop is the output end of the voltage comparison module.

6. The overcurrent protection circuit according to claim 5, further comprising:
a second protection resistor,
wherein the output end of the D-type positive-edge-triggered flip-flop is configured to be grounded via the second protection resistor.

7. The overcurrent protection circuit according to claim 4, further comprising:
a first protection resistor,
wherein the output end of the comparator is configured to be grounded via the first protection resistor.

8. The overcurrent protection circuit according to claim 1, wherein the voltage comparison module comprises a NAND gate circuit; and
wherein the first input end of the voltage comparison module is an input end of the NAND gate circuit, the second input end of the voltage comparison module is another input end of the NAND gate circuit, and the output end of the voltage comparison module is an output end of the NAND gate circuit.

9. A display driving device, comprising:
a driver chip; and
an overcurrent protection circuit, comprising a voltage generation module, a voltage comparison module a controlled switch module, and a bias resistor,
wherein a first input end of the voltage comparison module is configured to access a logic signal, a second input end of the voltage comparison module is configured to access the logic signal via the voltage generation module, and an output end of the voltage comparison module is connected to a controlled end of the controlled switch module,
wherein an input end of the controlled switch module is configured to access the logic signal, and an output end of the controlled switch module is configured to connect to an input end of the driver chip, wherein the controlled switch module comprises P-channel field effect transistor, the controlled end of the controlled switch module is a gate electrode of the P-channel field effect transistor, the input end of the controlled switch module is a source electrode of the P-channel field effect transistor, the output end of the controlled switch module is a drain electrode of the P-channel field effect transistor, and the gate electrode of the P-channel field effect transistor is connected to the source electrode of the P-channel field effect transistor via the bias resistor,
wherein the voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end, and
wherein an output end of the driver chip is configured to output a driving signal to a display array of a liquid crystal display panel.

10. The display driving device according to claim 9, wherein the voltage generation module comprises a voltage stabilizing circuit; and
wherein one end of the voltage stabilizing circuit is configured to access the logic signal, and to be connected to the second input end, and
another end of the voltage stabilizing circuit is configured to be grounded.

11. The display driving device according to claim 10, wherein the voltage stabilizing circuit comprises a voltage stabilizing capacitor.

12. The display driving device according to claim 9, wherein the voltage comparison module comprises a comparator; and
wherein the first input end of the voltage comparison module is an inverting input end of the comparator, the second input end of the voltage comparison module is a non-inverting input end of the comparator, and the output end of the voltage comparison module is an output end of the comparator.

13. The display driving device according to claim 12, wherein the voltage comparison module comprises a D-type positive-edge-triggered flip-flop; and
wherein a control end of the D-type positive-edge-triggered flip-flop is connected to the output end of the comparator, a pulse input end of the D-type positive-edge-triggered flip-flop is configured to access a preset high level signal, and an output end of the D-type positive-edge-triggered flip-flop is the output end of the voltage comparison module.

14. The display driving device according to claim 13, wherein the overcurrent protection circuit further comprises:
a second protection resistor,
wherein the output end of the D-type positive-edge-triggered flip-flop is configured to be grounded via the second protection resistor.

15. The display driving device according to claim 12, wherein the overcurrent protection circuit further comprises:
a first protection resistor,
wherein the output end of the comparator is configured to be grounded via the first protection resistor.

16. The display driving device according to claim 9, wherein the voltage comparison module comprises a NAND gate circuit; and
wherein the first input end of the voltage comparison module is an input end of the NAND gate circuit, the second input end of the voltage comparison module is another input end of the NAND gate circuit, and the output end of the voltage comparison module is an output end of the NAND gate circuit.

17. A display device, comprising:
a display driving device, comprising a driver chip and an overcurrent protection circuit;
a backlight panel; and
a display array,
wherein the overcurrent protection circuit comprises a voltage generation module, a voltage comparison module a controlled switch module, and a bias resistor,
wherein a first input end of the voltage comparison module is configured to access a logic signal, a second input end of the voltage comparison module is configured to access the logic signal via the voltage generation module, and an output end of the voltage comparison module is connected to a controlled end of the controlled switch module, wherein an input end of the controlled switch module is configured to access the logic signal, and an output end of the controlled switch module is configured to connect to an input end of the driver chip, wherein the controlled switch module comprises P-channel field effect transistor, the controlled end of the controlled switch module is a gate electrode of the P-channel field effect transistor, the input end of the controlled switch module is a source electrode of the P-channel field effect transistor, the output end of the controlled switch module is a drain electrode of the P-channel field effect transistor, and the gate electrode of the P-channel field effect transistor is connected to the source electrode of the P-channel field effect transistor via the bias resistor, wherein the voltage comparison module is configured to control the controlled switch module to be turned on with conduction between the input end and the output end of the controlled switch module through the controlled end when a voltage at the first input end is the same as a voltage at the second input end, and to control the controlled switch module to be turned off with no conduction between the input end and the output end of the controlled switch module through the controlled end when the voltage at the first input end is not the same as the voltage at the second input end, wherein an output end of the driver chip is configured to output a driving signal to the display array, and wherein the backlight panel is configured to provide a light source for the display array.

18. The display device according to claim 17, wherein the display array comprises a liquid crystal display array.

* * * * *